(12) United States Patent
Lingannagari et al.

(10) Patent No.: US 9,274,169 B2
(45) Date of Patent: Mar. 1, 2016

(54) ASYNCHRONOUS PROGRAMMABLE JTAG-BASED INTERFACE TO DEBUG ANY SYSTEM-ON-CHIP STATES, POWER MODES, RESETS, CLOCKS, AND COMPLEX DIGITAL LOGIC

(75) Inventors: Hanmanth Lingannagari, Folsom, CA (US); Vasan Karighattam, Davis, CA (US)

(73) Assignee: INTEL CORPORATION, Santa Clara, CA (US)

( * ) Notice: Subject to any disclaimer, the term of this patent is extended or adjusted under 35 U.S.C. 154(b) by 107 days.

(21) Appl. No.: 13/997,235

(22) PCT Filed: Mar. 25, 2012

(86) PCT No.: PCT/US2012/030495
§ 371 (c)(1),
(2), (4) Date: Mar. 11, 2014

(87) PCT Pub. No.: WO2013/147730
PCT Pub. Date: Oct. 3, 2013

(65) Prior Publication Data
US 2014/0181605 A1 Jun. 26, 2014

(51) Int. Cl.
*G01R 31/28* (2006.01)
*G01R 31/317* (2006.01)
(Continued)

(52) U.S. Cl.
CPC ........ *G01R 31/3177* (2013.01); *G01R 31/2815* (2013.01); *G01R 31/3172* (2013.01);
(Continued)

(58) Field of Classification Search
CPC ........... G01R 31/2815; G01R 31/3172; G01R 31/3177; G01R 31/318555; G01R 31/318572; G06F 11/267; G06F 11/2733; G06F 11/3656
USPC .................................. 714/727, 25, 729, 733
See application file for complete search history.

(56) References Cited

U.S. PATENT DOCUMENTS 6,094,729 A * 7/2000 Mann .................... G06F 11/348
714/25
6,142,683 A * 11/2000 Madduri ............... G06F 11/348
703/23

(Continued)

FOREIGN PATENT DOCUMENTS

WO 2013/147730 A1 10/2013

OTHER PUBLICATIONS

Akselrod et al., Platform Independent Debug Port Controller Architecture with Security Protection for Multi-Processor System-on-Chip ICs, 2006, EDAA, pp. 1-6.*

(Continued)

*Primary Examiner* — John J Tabone, Jr.
(74) *Attorney, Agent, or Firm* — Carrie A Boone, PC

(57) ABSTRACT

An asynchronous debug interface is disclosed that allows TAG agents, JTAG-based debuggers, firmware, and software to debug, access, and override any functional registers, interrupt registers, power/clock gating enables, etc., of core logic being tested. The asynchronous debug interface works at a wide range of clock frequencies and allows read and write transactions to take place on a side channel, as well as within the on chip processor fabric without switching into a debug or test mode. The asynchronous debug interface works with two-wire and four-wire JTAG controller configurations, and is compliant with IEEE standards, such as 1149.1, 1149.7, etc., and provides an efficient and seamless way to debug complex system-on-chip states and system-on-chip products.

20 Claims, 10 Drawing Sheets

(51) Int. Cl.
*G01R 31/3185* (2006.01)
*G06F 11/267* (2006.01)
*G06F 11/273* (2006.01)
*G06F 11/36* (2006.01)
*G01R 31/3177* (2006.01)

(52) U.S. Cl.
CPC ............ *G01R31/318555* (2013.01); *G01R 31/318572* (2013.01); *G06F 11/267* (2013.01); *G06F 11/2733* (2013.01); *G06F 11/3656* (2013.01)

(56) References Cited

U.S. PATENT DOCUMENTS

| | | | | |
|---|---|---|---|---|
| 6,145,100 A * | 11/2000 | Madduri | ............ | G06F 11/3632 713/400 |
| 6,154,856 A * | 11/2000 | Madduri | ............ | G06F 11/348 712/227 |
| 6,189,140 B1 * | 2/2001 | Madduri | ............ | G06F 11/348 712/227 |
| 6,779,145 B1 * | 8/2004 | Edwards | ............ | G06F 11/3636 324/73.1 |
| 7,284,174 B2 | 10/2007 | Dubey | | |
| 7,428,661 B2 | 9/2008 | Michael | | |
| 7,844,867 B1 * | 11/2010 | Reddy | ............ | G11C 29/16 714/718 |
| 7,886,150 B2 * | 2/2011 | Stollon | ............ | G01R 31/31719 713/169 |
| 7,900,110 B2 | 3/2011 | Whetsel | | |
| 2001/0037479 A1 * | 11/2001 | Whetsel | ............ | G01R 31/318572 714/724 |
| 2001/0037480 A1 * | 11/2001 | Whetsel | ............ | G01R 31/3172 714/727 |
| 2004/0210797 A1 | 10/2004 | Kimelman et al. | | |
| 2011/0066907 A1 * | 3/2011 | Whetsel | ............ | G01R 31/3177 714/733 |

OTHER PUBLICATIONS

Banerjee et al., Secure Scan Design Using Redundant Scan Register, 2011, Proc. of Int. Conf. on Advances in Computer Science, pp. 66-71.*

International Search Report and Written Opinion received for PCT Patent Application No. PCT/US2012/030495, mailed on Nov. 28, 2012, 9 pages.

International Preliminary Report on Patentability and Written Opinion received for PCT Patent Application No. PCT/US2012/030495, mailed on Oct. 9, 2014, 6 pages.

* cited by examiner

Figure 9

| N_idle_cycles = (TCK/clk) * MCF (where the MCF multiplying factor is 4) | | | |
|---|---|---|---|
| clock ratio (TCK/clk) | number of additional TCK clock cycles the TAP controller needs to be in idle state (N_idle_cycles) | TCK frequency (MHz) | core logic frequency (clk) (MHz) |
| 0.2 | 1 | 50 | 200 |
| 0.4 | 2 | 50 | 125 |
| 0.67 | 3 | 50 | 75 |
| 1 | 4 | 50 | 50 |
| 1.25 | 5 | 50 | 40 |
| 1.67 | 7 | 50 | 30 |
| 2.5 | 10 | 50 | 20 |
| 5 | 20 | 50 | 10 |
| 16.67 | 67 | 50 | 3 |
| 0.16 | 1 | 20 | 125 |
| 0.27 | 1 | 20 | 75 |
| 0.4 | 2 | 20 | 50 |
| 0.5 | 2 | 20 | 40 |
| 0.67 | 3 | 20 | 30 |
| 1 | 4 | 20 | 20 |
| 2 | 8 | 20 | 10 |
| 4 | 16 | 20 | 5 |
| 6.67 | 27 | 20 | 3 |
| 10 | 40 | 20 | 2 |

ASYNCHRONOUS PROGRAMMABLE JTAG-BASED INTERFACE TO DEBUG ANY SYSTEM-ON-CHIP STATES, POWER MODES, RESETS, CLOCKS, AND COMPLEX DIGITAL LOGIC

CROSS-REFERENCE TO RELATED APPLICATIONS

This application is a continuation of Patent Cooperation Treaty patent application No. PCT/US2012/030495, filed on Mar. 25, 2012, which is incorporated herein by reference in its entirety.

TECHNICAL FIELD

This application relates to the test equipment architecture under the 1149 standard.

BACKGROUND

Joint Test Action Group (JTAG) is the common name for what was later standardized as the IEEE 1149.1, "Standard Test Access Port and Boundary-Scan Architecture", where IEEE is short for the Institute of Electrical and Electronics Engineers. An IEEE 1149.7 standard is a complementary standard to IEEE 1149.1, adding additional functionality. JTAG was initially devised for testing printed circuit boards using boundary scan and is still widely used for this application.

The "boundary scan architecture" of IEEE 1149 uses a 5-pin serial protocol for setting and reading the values on pins without directly accessing the core logic. A serial scan path known as a boundary scan register (BSR) intercepts signals between the core logic and the pins. When the system is not in test mode, the boundary scan register connects the signals of the core logic to the pins transparently. In test mode, the BSR may be used to set and/or read values. In external mode, the values set or read will be the values of the I/O pads, also known as 'pins'. In internal mode, the values set or read will be the values of the core logic.

The BSR is a shift register, which forms a path around the core logic. Signal pins of the core logic of a system being tested are connected to cells that make up the BSR, with these cells surrounding the core logic (boundary). The shift register is connected to the input and exit of test equipment, allowing test vectors to be sent to the BSR, thus testing the core logic.

Despite this standardized approach, because the system under test is in a "test mode", some real-time scenarios are not tested using the boundary scan architecture.

Thus, there is a continuing need for a mechanism for performing real-time testing of core logic that overcomes the shortcomings of the prior art.

BRIEF DESCRIPTION OF THE DRAWINGS

The foregoing aspects and many of the attendant advantages of this document will become more readily appreciated as the same becomes better understood by reference to the following detailed description, when taken in conjunction with the accompanying drawings, wherein like reference numerals refer to like parts throughout the various views, unless otherwise specified.

FIG. 9 is a lookup table used by the software in the asynchronous debug interface of FIG. 1 to manage idle states in the TAP controller, according to some embodiments.

DETAILED DESCRIPTION

In accordance with the embodiments described herein, an asynchronous debug interface is disclosed that allows JTAG agents, JTAG-based debuggers, firmware, and software to debug, access, and override any functional registers, interrupt registers, power/clock gating enables, etc., of core logic being tested. The asynchronous debug interface works at a wide range of clock frequencies and allows read and write transactions to, take place on a side channel, as well as within the on-chip processor fabric without switching into a debug or test mode. The asynchronous debug interface works with two-wire and four-wire JTAG controller configurations, and is compliant with IEEE standards, such as 1149.1, 1149.7, etc., and provides an efficient and seamless way to debug complex system-on-chip states and system-on-chip products.

In the following detailed description, reference is made to the accompanying drawings, which show by way of illustration specific embodiments in which the subject matter described herein may be practiced. However, it is to be understood that other embodiments will become apparent to those of ordinary skill in the art upon reading this disclosure. The following detailed description is, therefore, not to be construed in a limiting sense, as the scope of the subject matter is defined by the claims.

Figure 1:
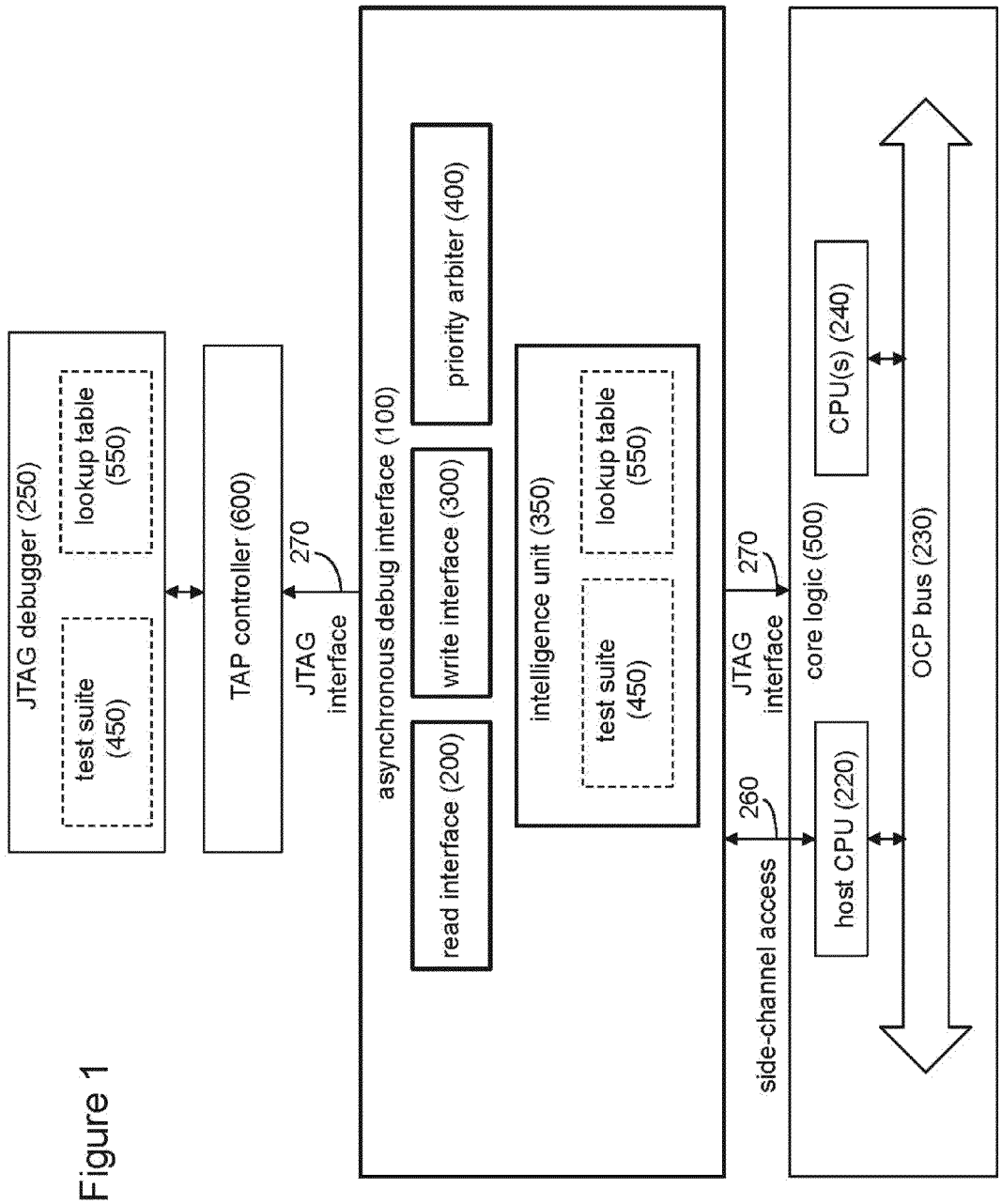
FIG. 1 is a simplified block diagram of an asynchronous debug interface, according to some embodiments.

A simplified block diagram of the asynchronous debug interface 100 is depicted in FIG. 1, according to some embodiments. The asynchronous debug interface 100 consists of a read interface 200, a write interface 300, a priority arbiter 400, and an intelligence unit 350. The asynchronous debug interface 100 operates in real time on the core logic 500 in two ways: 1) through a side channel connection 260 to the core logic, and 2) by utilizing a JTAG debugger 250 and TAP controller 600 through a JTAG interface 250. The asynchronous debug interface 100 is thus embedded into the JTAG network (e.g., the JTAG debugger 250 and the one or more TAP controllers 600).

As used herein, the asynchronous debug interface 100 is said to be running in real time when the core logic 500 being tested operates in its normal state, that is, without any disruption in its operation. Thus, the asynchronous debug interface 100 operates without changing the speed of any clocks operating within the core logic 500, and without changing the power being received by the core logic. Regarding the last point, the core logic 500 is not put into a low-power operating state when the asynchronous debug interface 100 is running tests on the core logic in real time.

The JTAG debugger 250 and TAP, or test access port, controller 600, are designed to operate under the IEEE 1149 standards, including, but not limited to, IEEE 1149.1 and IEEE 1149.7 (known herein as the JTAG standard). While the JTAG debugger 250 is capable of performing tests, on the core, logic 500 while the core logic is in a test mode, the asynchronous debug interface 100 operates on the core logic 500 in real time. The asynchronous debug interface 100 thus exploits the capability of the JTAG debugger 250 and TAP controller 600, but includes additional capability not supplied by the JTAG debugger 250 to facilitate performing real-time tests without disrupting the normal operation of the core logic 500.

The read interface 200 and write interface 300 of the asynchronous debug interface 100 handle the protocols between the TAP controller 600 and the core logic 500. The core logic 500 includes, at a minimum, a host CPU 220. In the simplified representation of FIG. 1, the core logic 500 includes the host CPU 220, and one or more additional CPUs 240, which are coupled to the host by an open core protocol (OCP) bus 230. For simplicity, other circuitry in the core logic 500 is not featured in FIG. 1, but the core logic may include additional functionality, including, but not limited to, networking capability, graphics and video capability, volatile and non-volatile storage media, and peripheral device circuitry. The priority arbiter 400 resolves conflicts between the JTAG debugger 250 and the host CPU 220 or other CPUs 240 of the core logic 500, when the two are simultaneously attempting to access the OCP bus 230.

The intelligence unit 350 may consist of hardware logic and/or a software program executed by a processor (not shown). In some embodiments, the intelligence unit 350 includes a suite of tests 450 and a lookup table 550, which are used in conjunction with the JTAG debugger 250 to test the core logic 500.

In some embodiments, as described below, the intelligence unit 350 includes the lookup table 550, which is sent to the JTAG debugger 250. The lookup table 550 enables the JTAG debugger 250 to obtain the number of clock cycles the TAP controller 600 needs to be in the idle state while waiting, for the bus access grant from the priority arbiter 400. In some embodiments, the values, in the lookup table 550 are determined by a novel formula that employs the relative clock rates of the TAP controller 600 and the core logic 500 in determining the idle state clock cycles.

A conventional debug method is to put the system being tested, also known as the system under test, into a particular test, or debug mode, with a single clock at a fixed frequency being used for both the system under test and the test logic. In FIG. 1, for example, the core logic 500 is the system under test Under conventional debug, the core logic 500 is thus switched between its functional mode, with the core logic operating as designed, and a test mode, in which debugging operations are performed. There are many disadvantages to this conventional approach, one of which is that the core, logic operating in the test mode does not faithfully represent the operation of the core logic in real time.

By contrast, the asynchronous debug interface 100 has the ability to debug or override any system-on-chip state or feature without putting the core logic 500 into a test mode. With this interface, there is no need to slow down the phase-locked-loop clocks of the core logic 500 for accessing any functional logic within the core logic. The asynchronous debug interface 100 works at a wide range of JTAG as well as functional clock frequencies and uses a unique hand-shaking mechanism and asynchronous protocols to transfer data between the functional and test clock domains. The asynchronous debug interface 100 thus provides a powerful mechanism to, debug functional logic in real time without any need for an expansive on-chip logic analyzer.

Figure 2:
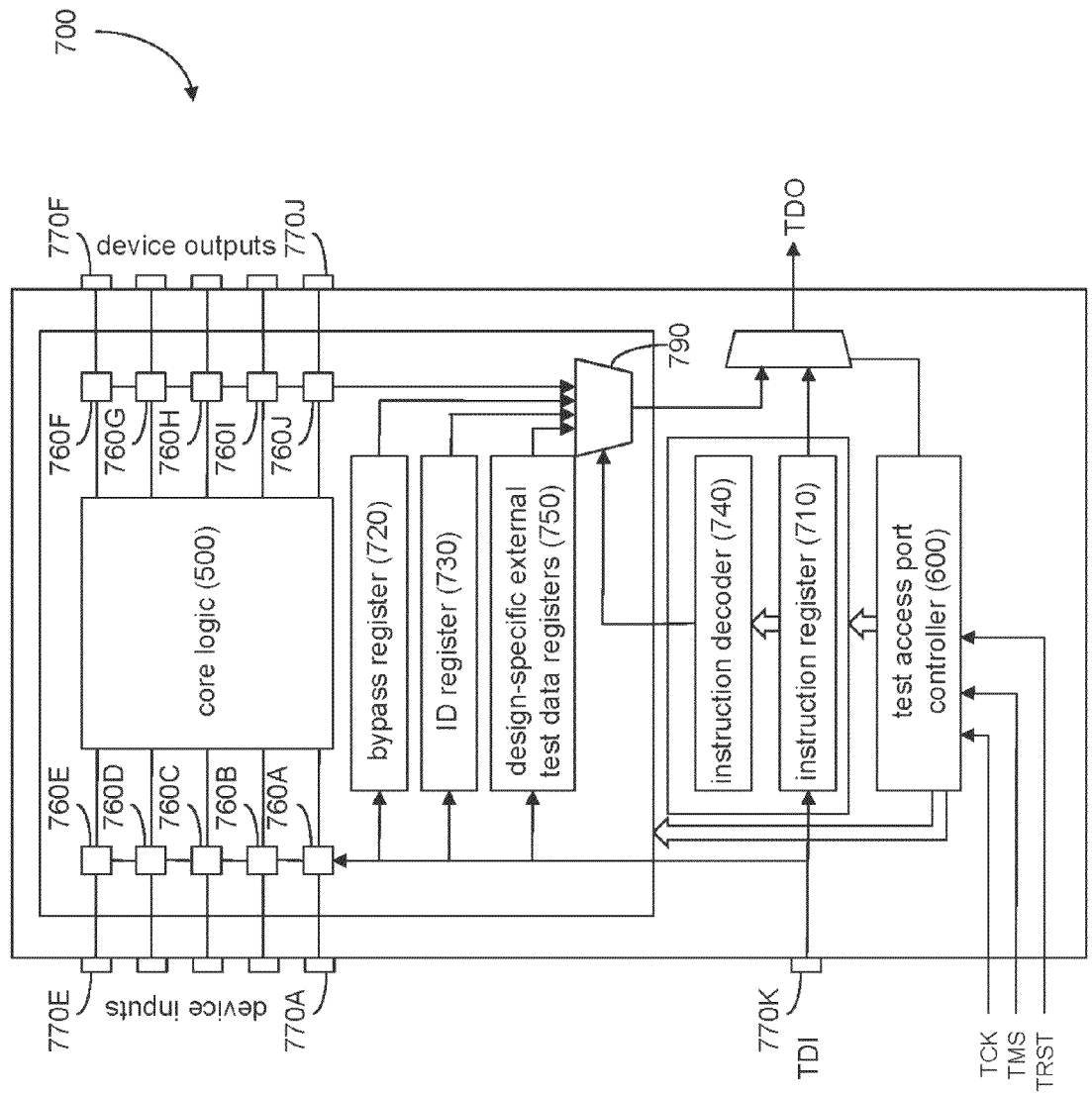
FIG. 2 is a simplified block diagram of a boundary scan architecture under IEEE 1149, including the core logic and TAP controller of FIG. 1, according to some embodiments.

Before describing the asynchronous debug interface further, an introduction to the boundary scan architecture under IEEE 1149 is appropriate. FIG. 2 shows a simplified schematic diagram of an 1149-complaint system 700, according to some embodiments, (The JTAG debugger 250 of FIG. 1 is an example of an 1149-compliant system.) Surrounding the core logic 500 is a plurality of boundary scan cells 760A-760J (collectively, "boundary scan cells 760"), which form a boundary scan register (BSR), corresponding I/O pads 770A-770J, plus an I/O pad 770K receiving an input, test data in (TDI), an instruction register 710 and instruction decoder 740, a bypass register 720, an ID register 730, one or more, design-specific external test data registers 750, and the test access port controller, or TAP controller 600, first introduced in FIG. 1. A TDI input feeds through the I/O pad 770K to the first boundary scan cell 760A, passes through each succeeding boundary scan cell 760B, 760C, . . . , 760J to a test data out (TDO) output.

Since there is only a single data input (TDI), the boundary scan architecture of FIG. 2 is serial. The 1149-complaint system 700 uses a test clock signal (TCK) to clock the data in, a test mode state signal (TMS), and, optionally, a test reset signal (TRST), as well as the TDI and TDO signals. The TAP controller 600 is a state machine, with transitions being controlled by the TMS signal. The state machine of the TAP controller 600 is capable of doing a reset operation, accessing an instruction register, and accessing data selected by the instruction register. For each TCK pulse, one bit of data is transferred into the TDI input and out of the TDO output.

During normal operation of the core logic 500, the boundary scan cells 760 are invisible. The system 700 may be in one of two test modes, an external test mode and an internal test mode. In the external test mode, the boundary scan cells 760 are used to set and read values of the I/O pads 770. In the internal test mode, the boundary scan cells 760 are used to set and read the values of the core logic 500.

The JTAG standard envisions at least two test data registers, the boundary scan register 760 surrounding the core logic 500 and the bypass register 720. Additionally, design-specific test data registers may be included to enable design-specific testing. These design-specific test data registers may be publicly accessible, but are not required to be so. In some embodiments, the test suite 450 programs the instruction register 710 with a user-defined (custom) instruction whenever the asynchronous debug interface 100 is to be used.

Figure 3:
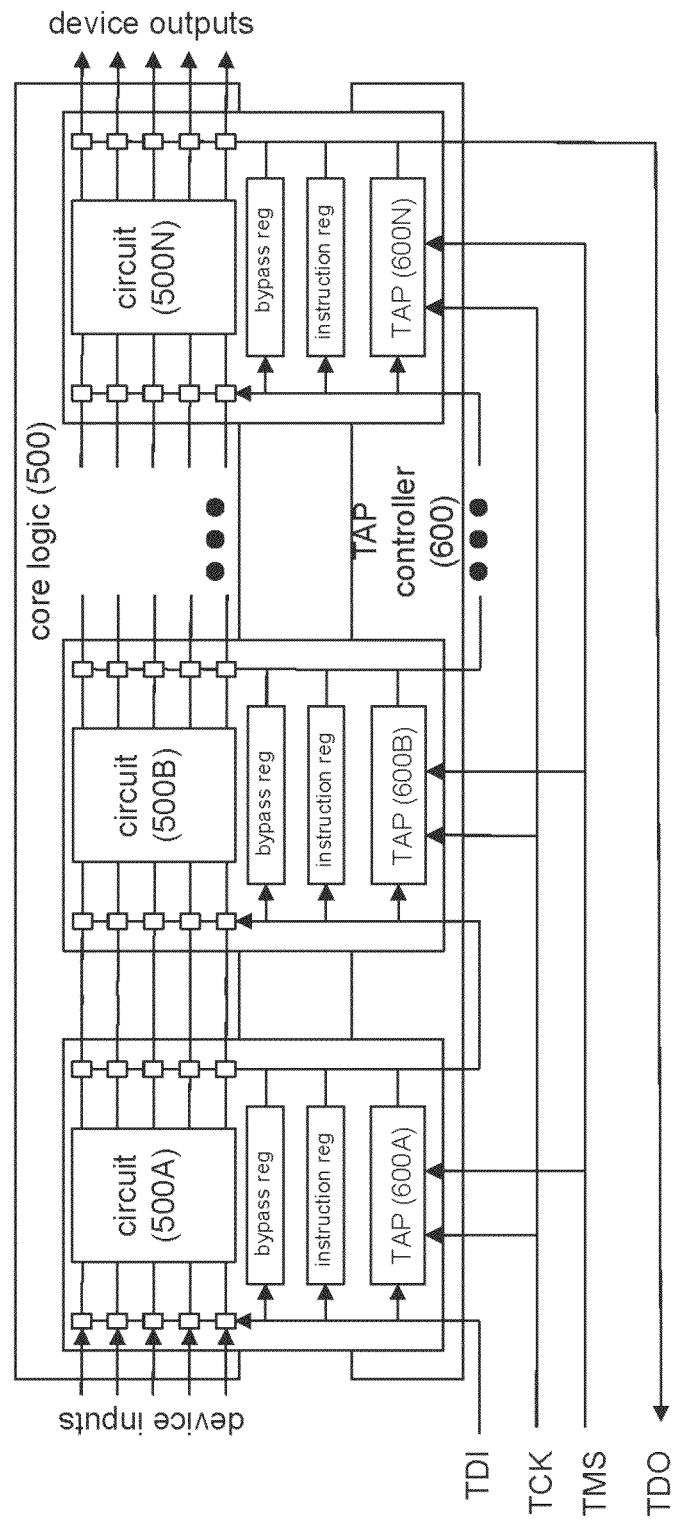
FIG. 3 is a block diagram of the boundary scan architecture of FIG. 2 replicated for different chips that make up the core logic of FIG. 1, according to some embodiments.

The TAP controller 600 may consist of a single TAP controller or multiple TAP controllers arranged in series with one another. FIG. 3, for example, features the TAP controller 600 having N individual TAP controllers. Each of these individual TAP controllers may be connected to a different circuit (500A, 500B, . . . , 500N) inside the core logic 500. For simplicity, the controller referred to herein as the "TAP controller 600" may consist of a single TAP controller or multiple TAP controllers.

Returning to FIG. 2, several registers of the 1149-compliant system 700 are shown as a set of shift-register-based elements connected in parallel between the common serial input (TDI) and the common serial output (TDO). The instruction register 710 controls which register, the boundary scan register 760, the device ID register 730, one of the design-specific test data registers 750, or the bypass register 720, forms the serial path between TDI and TDO at any given time. A multiplexer 790 controls the serial path between TDI and TDO, although other devices may be used instead to control the serial output.

The bypass register 720 provides a single-bit serial connection through the circuit when none of the other test data registers is selected. Because there may exist several TAP controllers 600, each one connected in serial to a different test circuit (FIG. 3), the bypass register 720 allows test data to flow through a device to other components without affecting the normal operation of the component. Thus, in FIG. 3, where the circuit 500A is not being tested but the circuit 500B is being tested, the bypass register 720 would be used with the first circuit so that test data, in essence, bypasses the first circuit entirely, and continues on to the second test circuit. The boundary scan register 760 allows testing of board interconnections and detecting production defects such as opens or shorts. The boundary scan register 760 also allows access to the inputs and outputs of components when testing their system logic or sampling of signals flowing through the system inputs and outputs. The device identification register 730 is an optional test data register that allows the manufacturer, part, number, and variant of a component to be determined.

FIG. 2 also shows design-specific test data registers 750. One or more of these registers, which are optional under 1149.1 and 1149.7, allow access to design-specific test support features, such as self-tests, scan paths, etc. They may be publicly available or wholly private, accessible only by following secure authentication, for example.

The design-specific test data registers are activated when the instruction register 710 indicates a user-defined instruction. In some embodiments, the asynchronous debug interface 100 interacts with these external test data registers 750. Again, the user-defined instructions may be public or private, based on the design requirements.

For example, as described above, a user-defined instruction may be sent to the instruction register 710, (by one of the programs in the test suite 450), causing a path to be created between the serial input (TDI) and the output (TDO) by way of a first external test data register 750. Thereafter, the data and controls needed to perform system debug may be shifted through the external test data register 750. The asynchronous debug interface 100 reads the contents of the external test data register 750 and performs the system debug of the core logic 500. Thus, the programming of the instruction register 710 with the user-defined (custom) instruction triggers the asynchronous debug interface 100 to perform real-time testing of the core logic 500.

Figure 4:
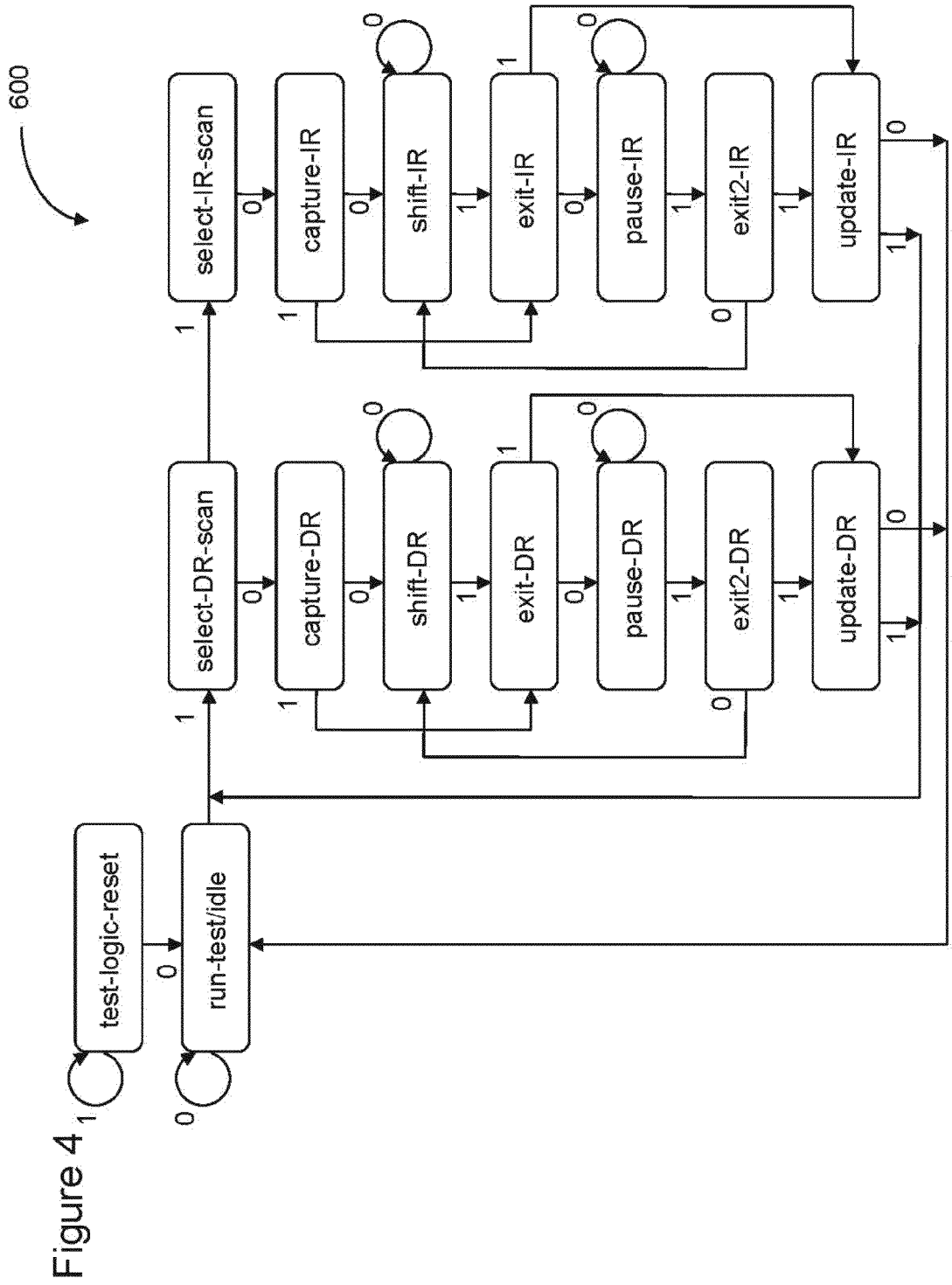
FIG. 4 is the state machine used by the TAP controller of the asynchronous debug interface of FIG. 1, according to some embodiments.

In some embodiments, the debug results, obtained by the asynchronous debug interface 100 may be loaded into the test data register 750 when the TAP controller 600 is in a "capture-DR" state, and may be shifted onto the output (TDO) during the "shift-DR" state. FIG. 4 shows the state diagram for the TAP controller 600, according to some embodiments. The rightmost part of the state machine pertains to the instruction register 710 (IR). This right side of the state machine 600 is thus for configuring the one or more TAP controllers 600 to perform a certain task by selecting one of the design-specific test data registers 750 by way of the instruction register 710. By loading the instruction register 710 with the user-defined instruction, one of the external test data register 750 is activated, and receives instructions from the intelligence unit 350 of the asynchronous debug interface 100, where the instructions may consist of the test suite 450.

The JTAG debugger 250 thus essentially converts the test suite 450 of the asynchronous debug interface 100 into the serial test vectors that are sent through the test data input (TDI) and TMS JTAG ports. Whenever real-time read or write operations are to be performed, the test suite 450 programs the user-defined custom instruction to the TAP controller 600. This activates either the read interface 200 or the write interface 300, and allows the reads and writes to occur through the side channel 260. The read and write operations may include, for example, overriding function registers within the core logic 500, turning on a modem within the core logic, turning off power to an audio block in the core logic, and so on.

The read and write interfaces 200, 300 of the asynchronous debug interface 100 handle the protocols between the TAP controller 600 and the core logic 500. Additionally, the programmable priority arbiter 400 is designed to resolve conflicts between the TAP controller 600 and the CPU(s) within the core logic 500.

Figure 5:
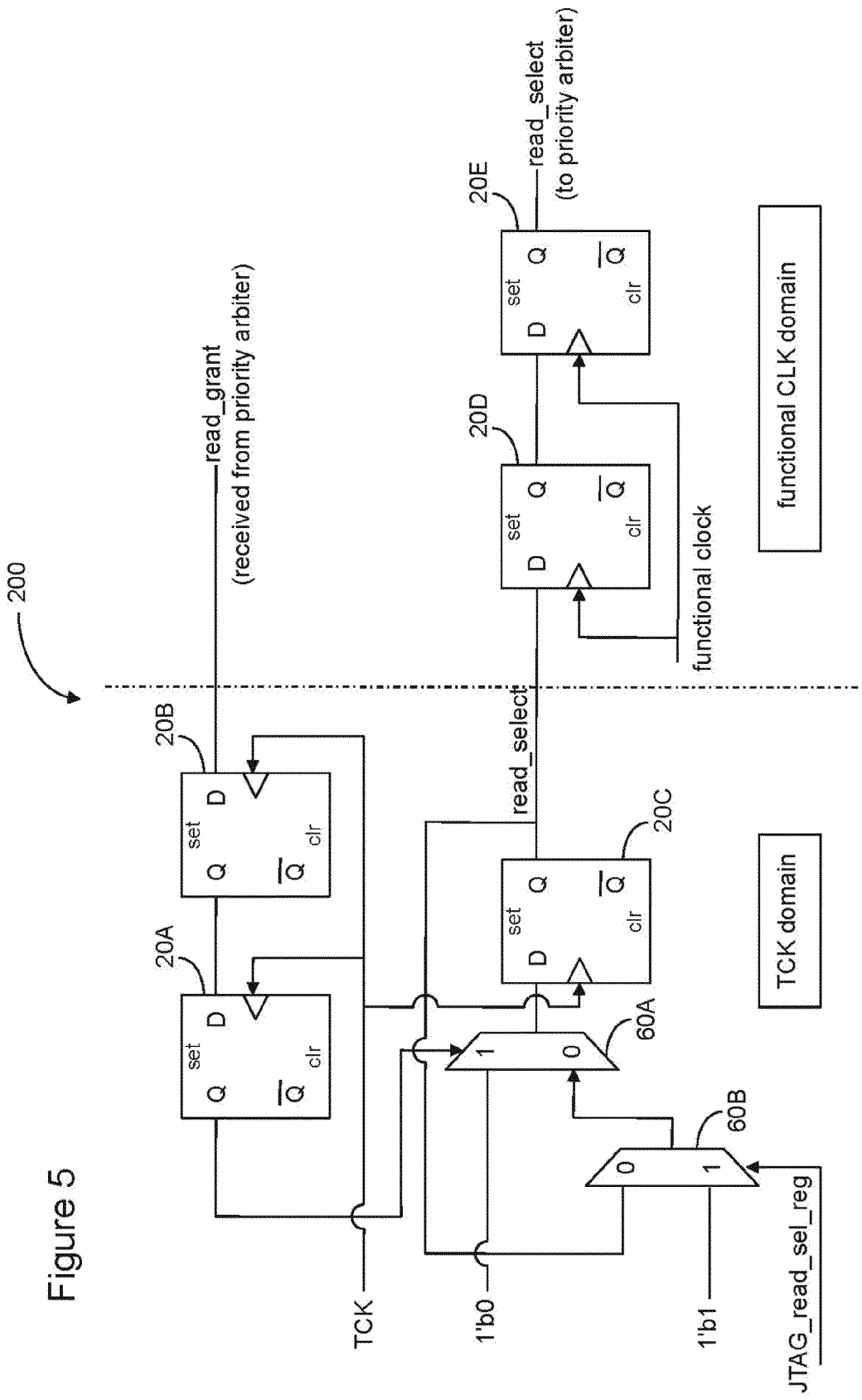
FIG. 5 is a schematic diagram of a read interface of the asynchronous debug interface of FIG. 1, according to some embodiments.

FIG. 5 is a schematic diagram of the read interface 200 of the asynchronous debug interface 100, according to some embodiments. Where the intelligence unit 350 is performing real-time read operations of registers, memory locations, or I/O pins of the core logic 500, the read interface 200 is used. The read interface 200 uses the same test clock TCK that is used by the TAP controller 600. Where conflict between reads and writes occur, the priority arbiter 400 resolves them.

The simplified dr wing of the read interface 200 in FIG. 5 splits the circuit into a TCK domain (left side) and a functional clock domain (right side), with the TCK being the clock used by the JTAG logic (JTAG debugger 250 and TAP controller 600) and the functional clock being the operating clock of the core logic 500. The read interface 200 includes five D flip-flops 20A-20E and two-to-one multiplexers (MUXes) 60A and 60B. Initially, the priority arbiter 400 ensures that the OCP bus 230 is not being used before issuing the read grant, shown in FIG. 5 as read_grant.

A JTAG read select register, JTAG_read_sel_reg, controls the select line of the MUX 60B, which feeds an "always high" input ($1'b1$) through the MUX to the MUX 60A. The JTAG_read_sel_reg is set when the user-defined instruction is sent to the instruction register 710 of the JTAG debugger 250. The MUX 60A is controlled by the output from the D flip-flop 20A. Meanwhile, exiting the functional clock domain, the read grant is fed into the D flip-flop 20B, is clocked through to the D flip-flop 20A (using the test clock, TCK), which controls the MUX 60A.

Since the MUX 60A has an always low input ($1'b0$), the input of the flip-flop 20C is fed to the Q output only after both the JTAG_read_sel_reg is activated and the read_grant is issued by the priority arbiter 400. This results in the read_select signal, which is clocked through two additional D flip-flops 20D and 20E by the functional clock (e.g., that of the core logic 500). The operation of the read interface 200 is thus complete.

Figure 6:
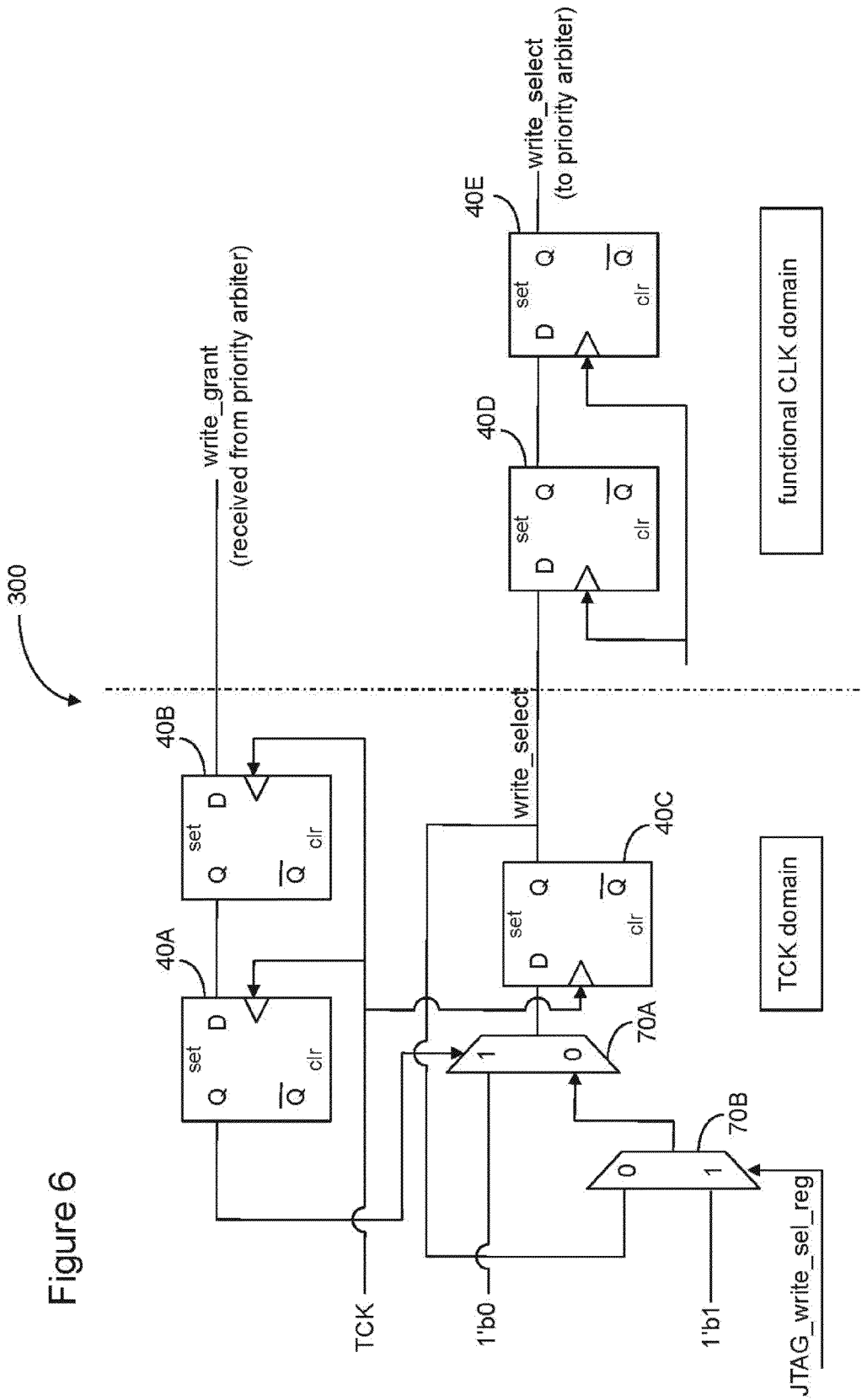
FIG. 6 is a schematic diagram of a write interface of the asynchronous debug interface of FIG. 1, according to some embodiments.

FIG. 6 is a schematic diagram of the write interface 300 of the asynchronous debug interface 100, according to some embodiments. Where the intelligence unit 350 is performing real-time write operations of registers, memory locations, or I/O pins of the core logic 500, the write interface 300 is used.

As with the read interface 200, the simplified drawing of the write interface 300 in FIG. 6 splits the circuit into a TCK domain (left side) and a functional clock domain (right side). The write interface 200 includes five D flip-flops 40A-40E and two-to-one multiplexers (MUXes) 70A and 70B. Initially, the priority arbiter 400 ensures that the OCP bus 230 is not being used before issuing the write grant, shown in FIG. 6 as write_grant.

A JTAG write select register, JTAG_write_sel_reg, controls the select line to the MUX 70B, which feeds an always high input (1'$b$1) through to the MUX 70A. The JTAG_write_sel_reg is set when the user-defined instruction is sent to the instruction register 710 of the JTAG debugger 250. The MUX 70A is controlled by the output from the D flip-flop 40A. Meanwhile, exiting the functional clock domain, the write grant is fed into the D flip-flop 40B, is clocked through to the D flip-flop 40A (using the test clock, TCK), which controls the MUX 70A.

Since the MUX 70A has an always low input (1'$b$0), the input of the D flip-flop 40C is fed to the Q output only after both the JTAG_write_sel_reg is activated and the write_grant is issued by the priority arbiter 400. This results in the write_select signal, which is clocked through two additional D flip-flops 40D and 40E by the functional clock (e.g., that of the core logic 500). The operation of the write interface 300 is thus complete.

Figure 7:
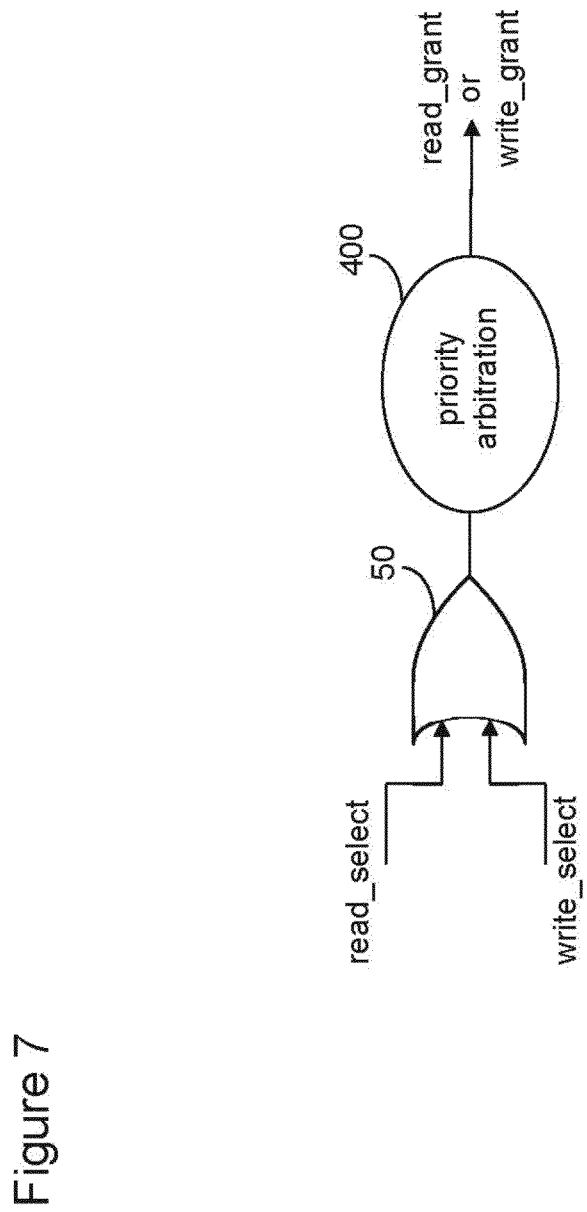
FIG. 7 is a schematic block diagram showing the connection between the read and write interfaces and the priority arbiter of the asynchronous debug interface of FIG. 1, according to some embodiments.
Figure 8:
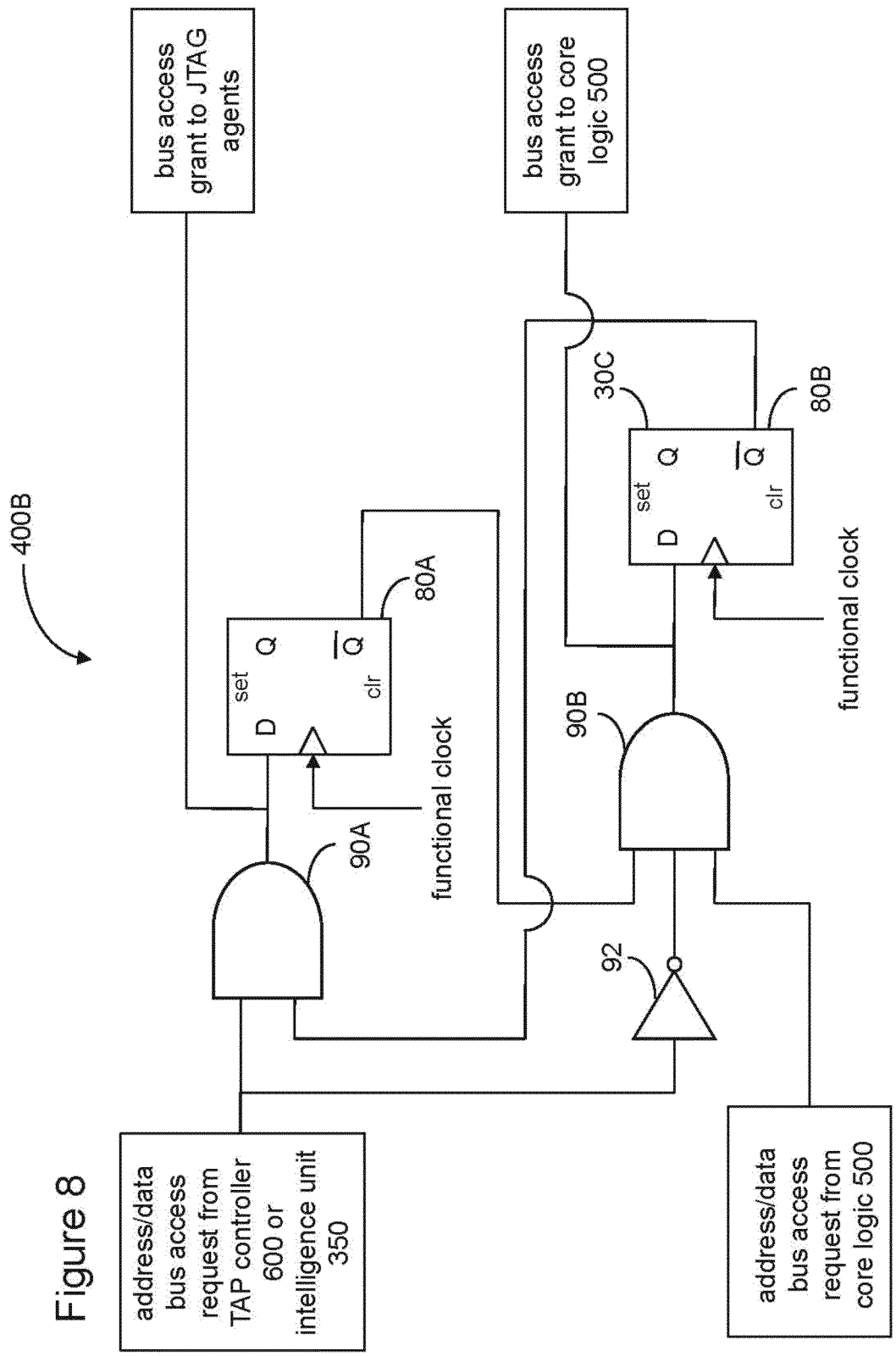
FIG. 8 is a schematic diagram of a priority arbiter, used by the asynchronous debug interface of FIG. 1, according to some embodiments.

FIG. 7 is a simplified diagram showing how the priority arbiter 400 generates either the read_grant or write_grant signal, after receiving the read_select or write_select signal. The priority arbiter 400 is illustrated in FIG. 8, according to some embodiments.

Where the core logic 500 and the intelligence unit 350 of the asynchronous debug interface 100 are each requesting use of the address/data bus (e.g., the OCP bus 230 that is part of the core logic 500), the priority arbiter 400 resolves the conflict. In FIG. 8, the priority arbiter 400 consists of two D flip-flops 80A, 80B, two AND gates 90A, 90B, and an inverter 92. Both of the C flip-flops 80A, 80B are controlled by the functional (core, logic) clock.

Whenever a real-time read or write operation is to be performed by the asynchronous debug interface 100, the intelligence unit 350 requests access to the OCP bus 230 of the core logic 500. When the request is clocked through the D flip-flop 80A, the Q result is the same as the D input, and is, thus fed through the AND gate 90A, which is then inverted by the inverter 92. The other input of the AND gate comes from the request for bus access from the core logic 500.

Meanwhile, the core logic 500 may also be requesting access to the OCP bus 230, as indicated in the lower part of the circuit diagram. The request is clocked through the D flip-flop 80B by the functional clock, and is fed into the AND gate 90C, the other input of which comes from the JTAG agent request (e.g., the TAP controller 600 or the intelligence unit 350 of the asynchronous debug interface 100) for bus access.

Recall from FIG. 1 that the intelligence unit 350 of the asynchronous debug interface 100 includes a test suite 450 and a lookup table 550, in some embodiments, both of which are loaded into the JTAG debugger 250 in performing tests on the core logic 500. The test suite 450 is executed by the JTAG debugger 250 or other JTAG agent and operates with the JTAG-compliant TAP controller 600. Based on the data received from the core logic 500, the asynchronous debug interface 100 reads from and writes to the registers of the core logic 500.

As its name suggests, the asynchronous debug interface 100 operates asynchronously. The JTAG debugger 250 and the core logic 500 are operating using different clocks. Thus, in some embodiments, the asynchronous debug interface 100 uses the lookup table 550 to insert wait states during these read and write operations.

FIG. 9 is the lookup table 550, as introduced in FIG. 1, according to some embodiments, used by the asynchronous debug interface 100. The lookup table 550 shows a small set, of many possible frequency combinations between the test clock TCK used by the TAP controller 600 and a functional clock used by the core logic 500. The lookup table 550 also summarizes the number of additional TCK clock cycles the TAP controller 600 needs to be parked in the idle state between each read and write transaction to allow the host CPU to handle the side-channel 260 transactions properly. As used herein, side-channel transactions refer to any transaction between the asynchronous debug interface 100 and the host CPU 220 in the core logic 500, not involving the JTAG interface 270. The host CPU 220, in turn, communicates with one or more additional processors (shown as CPU 240) over the OCP bus 230 to perform transactions.

In some embodiments, the lookup table 550 uses the following formula in calculating the number of TAP controller idle cycles:

$N\_idle\_cycles = (TCK/clk)*MCF$ where TCK is the clock for the TAP controller 600, clk is the clock for the core logic 500, and MCF is a multiplying clock factor. In the lookup table 550, MCF is four. The MCF is a constant that is based on the design of the core logic 500. The MCF may change depending on various factors, such as the number of TAP controllers in the multiple-TAP JTAG network, the frequency of the core logic clock, the latency of the side-channel 260 data path, and other operating conditions and design considerations.

Suppose the core logic 500 clock, clk, is operating at 100 MHz. As indicated in the lookup table 550, the test clock, TCK, may operate at either 50 MHz (blue) or at 20 MHz (yellow). Where the test clock operates at 50 MHz (blue), the number of idle cycles needed for the TAP controller 600 is:

$N\_idle\_cycles = (TCK/clk)*MCF = 50/100*4 = \frac{1}{2}*4 = 2$

Thus, when the test clock operates at 50 MHz and the core logic clock operates at 100 MHz, the TAP controller 600 would be parked in an idle state for two clock cycles between each read and, write transaction.

Where the test clock operates at 20 MHz (yellow), the number of idle cycles needed for the TAP controller 600 is:

$$N\_idle\_cycles = (TCK/clk)*MCF = 20/100*4 = \frac{1}{5}*4 = 0.8$$

In this case, the 0.8 value is rounded up to a 1. Thus, when the test clock is operating at 20 MHz and the core logic clock operates at 100 MHz, the TAP controller 600 would be parked in an idle state for a single clock cycle between each read and write transaction.

The number of idle states goes up significantly when there is a significant disparity between the test clock TCK rate and the core logic clk rate. For example, where the core logic 500 operates at 1 MHz and the TAP controller 600 operates at 50 MHz (pink), the number of idle cycles needed for the TAP controller 600 is:

$N\_idle\_cycles = (TCK/clk)*MCF = 50/1*4 = 50*4 = 200$

Thus, when the test clock is operating at 50 MHz and the core logic clock is at 1 MHz, the TAP controller 600 would be parked in an idle state for two-hundred clock cycles between each read and write transaction.

Where instead the core logic 500 operates at 1 MHz and the TAP controller 600 operates at 20 MHz (green), the number of idle cycles needed for the TAP controller 600 is:

$N\_idle\_cycles = (TCK/clk)*MCF = 20/1*4 = 20*4 = 80$

Thus, when the test clock is operating at 20 MHz and the core logic is at 1 MHz, the TAP controller 600 would be parked in an idle state for eighty clock cycle between each read and write transaction.

Because the core logic 500 may operate at different clock frequencies, the intelligence unit 350 of the asynchronous debug interface 100 uses the lookup table 550 to determine how many idle states to insert between each read transaction and each write transaction. The state machine shown in FIG. 4 allows these idle states to be introduced by sending zeros to the TAP controller 600. As long as the TAP controller receives zeros, the state machine will remain in the run-test/idle state.

Figure 10:
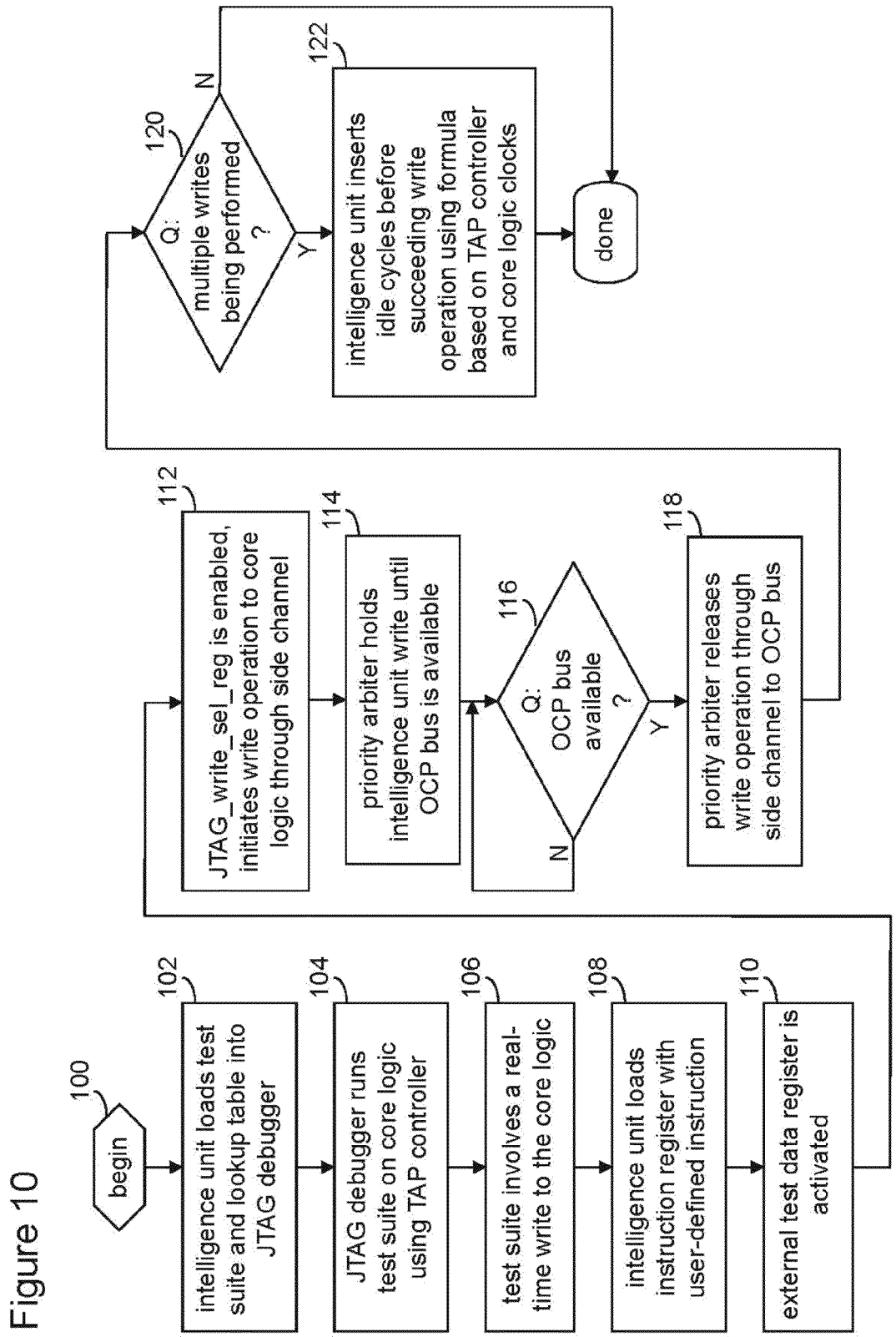
FIG. 10 is a flow diagram showing a write operation being performed by the asynchronous debug interface of FIG. 1, according to some embodiments.

FIG. 10 is a flow diagram showing how multiple write operation are performed by the asynchronous debug interface 100, according to some embodiments. The intelligence, unit 350 loads the test suite 450 and the lookup table 550 into the JTAG debugger 250 (block 102). Using the TAP controller 600, the boundary scan register 760, and the JTAG interface 270, the JTAG debugger 250 runs one or more tests in the test suite 450 on the core logic 500.

Recall that the JTAG debugger 250 operates in either an external test mode, in which the boundary scan cells 760 are used to set and read values of the I/O pads 770, and an internal test mode, in which the boundary scan cells 760 are used to set and read the values of the core logic 500. In this case, however, the asynchronous debug interface 100 operates in real time. Thus, during the execution of the test suite 450, there is bound to be a read operation from the core logic 500 or a write operation to the core logic that may result in conflict with operations taking place inside the core logic.

When, for example, a real-time write operation is to take place (block 106), the intelligence unit 350 loads a user-defined instruction into the JTAG debugger 250 (block 108). Recall that when a user-defined instruction is sent to the instruction register 710, this causes a path between the serial input (TDI) and the serial output (TDO) by way of one of the external test data registers 750. Thus, the external test data register 750 is activated (block 110). Based on the custom instruction in the JTAG instruction register 710 and the contents of the external test data register 750, the intelligence unit 350 of the asynchronous debug interface 100 derives the write request and stores it in the register, JTAG_write_sel_reg, where this register drives the select line of the MUX 70B (FIG. 6). Similarly, where the external test data register 750 contains a read request, the intelligence unit 350 of the asynchronous debug interface 100 derives the read request and stores it in the register, JTAG_read_sel_reg, where this register drives the select line of the MUX 60B (FIG. 5).

Once the external test data register 750 is activated, the intelligence unit 350 uses the write interface 300 to perform a write operation on a register, memory location, or I/O port of the core logic 500 (block 112). Because this is happening in real time, the priority arbiter 400 holds the write initiated by the intelligence unit 350 until the OCP bus 230 is available (block 114). Once the OCP bus is available (block 116), the priority arbiter 400 releases the write operation through the side-channel access 260 to the OCP bus (block 118). Because the JTAG debugger 250 does not consider real-time operations, the intelligence unit 350 instead uses the write interface 300, as described above to perform the write operation to the core logic 500.

Where multiple write operations are being performed (block 120), the intelligence unit 350 triggers the JTAG debugger 250 and TAP controller 300 to insert idle cycles between succeeding write operations (block 122). Thus, the TAP controller 600 remains in the run-test/idle state (for the number of cycles as determined by the lookup table 550) while the read/write operations are performed on the core logic 500 through the side channel 260.

Since the JTAG debugger 250 and TAP controller 300 operate using the test clock and the core logic 500 operates using the functional clock, the idle cycles enable the test suite 450 to perform operations on the core logic without disrupting its normal operation, thus enabling the asynchronous debug interface 100 to obtain a higher quality of test results. In ether words, the test results reflect the real-time operation of the core logic 500.

The asynchronous debug interface 100 thus allows JTAG agents and firmware or software to debug the functional logic of a system without any dependency on the expansive on-chip probing logic and provides an efficient and seamless way to debug complex system-on-chip states and system-on-chip-based products.

While the application has been described with respect to a limited number of embodiments, those skilled in the art will appreciate numerous modifications and variations therefrom. It is intended that the appended claims cover all such modifications and variations as fall within the true spirit and scope of the invention.

We claim:

1. A system to asynchronously debug a core logic, the core logic comprising a central processing unit, a bus, and a functional clock, the system comprising:
   an intelligence unit comprising a test program executed by a joint test action group-compliant (JTAG compliant) debugger, the JTAG compliant debugger to operate with a JTAG-compliant test access port (TAP) controller using a test clock, the test program to be run on the core logic through a JTAG interface in real time;
   a read interface to read from a register, a memory location, or an input/output (I/O) port of the core logic through a side channel;
   a write interface to write to the register, the memory location, or the I/O port of the core logic through the side channel; and
   a priority arbiter to arbitrate between access to the bus of the core logic by either the intelligence unit or circuitry within the core logic;
   wherein a predetermined number of idle states is sent to the core logic by the test program using the JTAG interface in between succeeding write operations to or read operations from the register, the memory location, or the I/O port of the core logic, wherein the succeeding write operations to or read operations from are taking place through the side channel.

2. The system of claim 1, wherein the predetermined number of idle states is based on the functional clock frequency and the test clock frequency.

3. The system of claim 2, wherein the predetermined number of idle states is calculated using the following formula:

$$N\_idle\_cycles = (TCK/clk) * MCF$$

wherein TCK is the test clock frequency, clk is the functional lock frequency, and MCF is a multiplying factor.

4. The system of claim 3, wherein the multiplying factor is based on the number of TAP controllers, the functional clock frequency, and the latency of a data path between the core logic and the TAP controller.

5. The system of claim 3, wherein the multiplying factor is four.

6. The system of claim 1, the intelligence unit further comprising:
   a lookup table comprising:
      a plurality of frequencies for the functional clock;
      a plurality of frequencies for the test clock; and a number of idle states, based on the functional clock and test clock frequencies;

wherein the test program:
- obtains the predetermined number of idle states from the lookup table; and
- sends the predetermined number to the TAP controller.

7. The system of claim 1, wherein the predetermined number comprises the number of run-state/idle states between an instruction register of the TAP controller and a data register.

8. The system of claim 1, wherein the TAP controller comprises N distinct TAP controller units, with each TAP controller unit being coupled to a different circuit within the core logic.

9. A method to asynchronously debug a core logic, the core logic comprising a central processing unit, a bus, and a functional clock, the method comprising:
- executing, by an intelligence unit, a test program on a joint test action group (JTAG) debugger in conjunction with a JTAG test action port (TAP) controller using a test clock, the test program to be run on the core logic through a JTAG interface in real time;
- sending, by the test program, a user-defined instruction to the JTAG debugger, wherein the user-defined instruction causes a write select register to be enabled in a write interface;
- initiating, by the test program, a first write operation to the core logic, the first write operation to occur through a side channel between the write interface and the core logic, wherein the JTAG debugger and JTAG TAP controller are not part of the side-channel transaction;
- sending, by the intelligence unit, a predetermined number of idle states to the core logic, wherein the intelligence unit uses the JTAG debugger, the TAP controller, and the JTAG interface to send the idle states to the core logic; and
- initiating, by the intelligence unit, a second write operation to the core logic, wherein the second write operation is sent through the side channel.

10. The method of claim 9, further comprising:
interrupting, by a priority arbiter, the first write operation initiated by the intelligence unit, wherein the bus is being used by circuitry of the core logic.

11. The method of claim 10, further comprising:
allowing, by the priority arbiter, the first write operation to be sent to the core logic using the side channel.

12. The method of claim 9, further comprising:
obtaining the predetermined number from lookup table loaded into the JTAG debugger by the intelligence unit.

13. The method of claim 9, further comprising:
calculating the predetermined number based on a frequency, of the functional clock frequency and a second frequency of the test clock.

14. The method of claim 9, further comprising:
calculating the predetermined number based on the following formula:

$$N\_idle\_cycles = (TCK/clk)*MCF$$

wherein TCK is a frequency of the test clock, clk is a frequency of the functional clock, and MCF is a multiplying factor.

15. A method to asynchronously debug a core logic, the core logic comprising a central processing unit, a bus, and a functional clock, the method comprising:
- executing, by an intelligence unit, a test program on a joint test action group (JTAG) debugger in conjunction with a JTAG test action port (TAP) controller using a test clock, the test program to be run on the core logic through a JTAG interface in real time;
- sending, by the test program, a user-defined instruction to the JTAG debugger, wherein the user-defined instruction causes a read select register to be enabled in a read interface;
- initiating, by the test program, a first read operation from the core logic, the first read operation to occur through a side channel between the read interface and the core logic, wherein the JTAG debugger and JTAG TAP controller are not part of the side-channel transaction;
- sending, by the intelligence unit, a predetermined number of idle states to the core logic, wherein the intelligence unit uses the JTAG debugger, the TAP controller, and the JTAG interface to send the idle states to the core logic; and
- initiating, by the intelligence unit, a second read operation from the core logic, wherein the second read operation is sent through the side channel.

16. The method of claim 15, further comprising:
interrupting, by a priority arbiter, the first read operation initiated by the intelligence unit, wherein the bus is being used by circuitry of the core logic.

17. The method of claim 16, further comprising:
allowing, by the priority arbiter, the first read operation to be sent to the core logic using the side channel.

18. The method of claim 15, further comprising:
obtaining the predetermined number from a lookup table loaded into the JTAG debugger by the intelligence unit.

19. The method of claim 15, further comprising:
calculating the predetermined number based on a frequency of the functional clock frequency and a second frequency of the test clock.

20. The method of claim 15, further comprising:
calculating the predetermined number based on the following formula:

$$N\_idle\_cycles = (TCK/clk)*MCF$$

wherein TCK is a frequency of the test clock, clk is a frequency of the functional clock, and MCF is a multiplying factor.

* * * * *